United States Patent [19]

Kinoshita

[11] Patent Number: 4,958,357
[45] Date of Patent: Sep. 18, 1990

[54] GRATING-COUPLED SURFACE EMITTING LASER AND METHOD FOR THE MODULATION THEREOF

[75] Inventor: Junichi Kinoshita, Yokohama, Japan

[73] Assignee: Kabushiki Kaisha Toshiba, Kawasaki, Japan

[21] Appl. No.: 286,027

[22] Filed: Dec. 19, 1988

[30] Foreign Application Priority Data

Dec. 19, 1987 [JP] Japan ................. 62-321707
Apr. 11, 1988 [JP] Japan ................. 63-88697
Jun. 10, 1988 [JP] Japan ................. 63-141622

[51] Int. Cl.$^5$ .............................................. H01S 3/10
[52] U.S. Cl. ........................................ 372/96; 372/26; 372/50
[58] Field of Search ............................. 372/50, 96, 26

[56] References Cited

U.S. PATENT DOCUMENTS

| 4,006,432 | 2/1977 | Streifer et al. | 331/94.5 C |
| 4,751,710 | 6/1989 | Yamaguchi et al. | 372/50 |
| 4,799,223 | 1/1989 | Streifer et al. | 372/50 |
| 4,802,187 | 1/1989 | Bouley et al. | 372/50 |
| 4,829,535 | 5/1989 | Utaka | 372/50 |

FOREIGN PATENT DOCUMENTS

| 0205139 | 12/1986 | European Pat. Off. |
| 57-170582 | 10/1982 | Japan . |
| 61-255086 | 11/1986 | Japan . |
| 62-172780 | 7/1987 | Japan . |

OTHER PUBLICATIONS

Walpole, James N., "R&D on surface-Emitting Diode Lasers", Laser Focus/Electro-Optics, Sep. 1987, pp. 66-74.

Burnham et al., "Single-Heterostructure Distributed-Feedback GaAs-Diode Lasers", IEEE Journal of Quantum Electronics, vol. QE-11, No. 7, Jul. 1975, pp. 439-448.

Henry et al., "Observation of Destructive Interference in the Radiation Loss of Second-Order Distributed Feedback Lasers", IEEE Journal of Quantum Electronics, vol. QE-21, No. 2, Feb. 1985, pp. 151-154.

Soda et al., "Stability in Single Longitudinal Mode Operation in GaInAsP/InP Phase-Adjusted DFB Lasers", IEEE Journal of Quantum Electronics, vol. QE-23, No. 6, Jun. 1987, pp. 804-814.

T. Kimura et al., "Linewth Reduciton by Coupled Phase-Shift Distributed-Feedback Lasers", Electronics Letters, vol. 23, No. 19, Sep. 10, 1987, pp. 1014-1015.

Mitsunaga et al., "Surface Emitting AsAs/AlGaAs DFB-TJS Laser", OQE86-152, pp. 47-53.

*Primary Examiner*—James W. Davie
*Attorney, Agent, or Firm*—Finnegan, Henderson, Farabow, Garrett, and Dunner

[57] ABSTRACT

Disclosed is a grating-coupled surface emitting laser capable of obtaining a beam with high directivity, structured by forming a light output window in a limited regions with high intensity radiations along the propagation direction. Its intensity distribution of radiation mode along the axis can be controlled by injecting a current independently into the multiply-divided electrodes or by pumping optically these electrodes independently. The control is, in principle, achieved by an equivalent change of the phase-shift of the gratings.

7 Claims, 9 Drawing Sheets

OPTICAL INTENSITY DISTRIBUTION

OPTICAL INTENSITY DISTRIBUTION

OPTICAL INTENSITY DISTRIBUTION

GRATING-COUPLED SURFACE EMITTING LASER AND METHOD FOR THE MODULATION THEREOF

The present application claims priority of Japanese Patent Application No. 62-321707 filed on Dec. 19, 1987, No. 63-88697 filed on Apr. 11, 1988, and No. 63-141622 filed on June 10, 1988.

FIELD OF THE INVENTION AND RELATED ART STATEMENT

The present invention relates to a distributed feedback laser with 2nd or more-order gratings, which means periodically perturbed waveguide, and more particularly to a grating-coupled surface light emitting laser for picking up its light output in radiation modes and a method for the modulation thereof.

Recently, various kinds of semiconductor light emitting devices have been employed as light sources in optical communication systems and optical disk systems.

In such light emitting devices, distributed feedback (DFB) diode lasers which have a periodically perturbed waveguide structure are capable of oscillating in a single longitudinal mode. At present, this type of laser, using GaInAsP/InP material, is practically used as a light source in long-haul and high bit-rate optical communication systems. The following structure is well-known among various DFB laser structures. That is a structure which has low reflectivity end-facets and a phase-discontinuity (a phase-shift) of the periodic corrugations at the cavity center. The low-reflective facets are, for example, realized by an anti-reflection (AR) coating technique. If the amount of the phase-shift is equal to a quarter of the wavelength ($\lambda/4$) in the waveguide structure, the lasing occurs just at the Bragg wavelength. Also, it is advantageous in single longitudinal mode operation because this structure has an extremely large threshould gain difference between the oscillating mode (the main mode) and other longitudinal modes (sub-modes).

In semiconductor lasers including distributed feedback lasers, the light output is generally obtained from the cleaved facets. The emitted light spreads widely in the vertical direction, since the beam divergence is determined by the diffraction-limit of the spot size of the propagating beam at the ends of the thin waveguide layer (including an active layer). For example, the beam divergence normal to the junction plane is about 30° to 50° as a full angle at half maximum. Therefore, the efficiency of coupling to various optical components such as an optical fiber is small.

Moreover, the end-facets (edges) are formed by almost manual cleaving, and dielectric thin films and metal films must be coated on the cleaved facets to adjust their reflectivity. Therefore, procedure for producing the laser structure is far from "mass production".

In contrast to such conventional edge-emitting devices, there has been a trial of obtaining the light output using gratings.

This utilizes the following mechanism. That is, when the 2nd or higher order Bragg-diffracted waves are used for the DFB coupling, the lower-order diffracted waves are emitted out of the cavity as "radiation modes" which have a very narrow beam divergence. Output beams (radiation modes) which are almost normal to the cavity direction can be emitted particularly when the 2nd-order Bragg-coupling is used. Since the beam divergence of the radiation modes is as extremely narrow as about 1°, a highly efficient coupling to the various optical components can be acheived. In fact, such a grating-coupled surface emitting laser has been realized (for example, a GaAlAs/GaAs TJS-type grating-coupled laser is fabricated by Mitsunaga et al, The Institute of Electronics, Information and Communication Engineers, Japan, Report OQE-86-152).

Although these surface emitting devices with the 2nd-order gratings have a great advantage of obtaining very narrow output beams normal to the cavity direction, their radiation field has a certain distribution along the cavity. Thus, it is difficult to focus such a long emitting area into a micro-spot. This situation can be explained in detail as follows, using a structure illustrated in FIG. 1(a). The structure is composed of n-type GaInAsP optical guiding layer 3 (of which bandgap energy corresponds to $\lambda=1.15$ $\mu$m), undoped GaInAsP active layer 4 (of which bandgap energy corresponds to $\lambda=1.3$ $\mu$m), p-type InP cladding layer 5 and p+-type GaInAsP ohmic contact layer 6, which are all successively grown on a n-type corrugated InP substrate 1 (the corrugation implies the grating 2). Assuming this DFB laser structure has no phase-shifters and has zero-reflectivity facets, the optical intensity (photon density) distribution profile along the cavity becomes as the curve b plotted in FIG. 1(b). Where, intensity profiles of a guided mode are expressed as $|R|^2+|S|^2$ (wherein R denotes the Z-dependent complex amplitude of running wave R(z) and S denotes that of counter-running (scattered) wave S(z)).

In this structure, as pointed out by Henry et. al., two radiation modes, which are produced by the R-wave and the S-wave respectively, interfere constructively for the longer-mode of the two longitudinal modes existing at both sides of the stop-band (The stop-band appears around the Bragg wavelength, and is peculiar to DFB lasers. Here the longer mode is defined as 1 mode, and the shorter one +1 Though the sign "±" seems reverse of the concept of "long and short", it is defined from the viewpoint of phase-constant whose sign is the reverse of wavelength).

Thus, the radiated output of the −1st mode from the surface is very strong because of the constructive interference (see IEEE Journal of Quantum Electronics, Vol. QE-21, p. 151, 1985). Namely, the profile of the nearfield pattern of the radiation mode in the axial direction can be expressed as $|R+S|^2$ and is shown by a curve a in FIG. 1(b).

In contrast, for the wavelength mode (+1mode), two radiation modes generated by the running wave R and the scattered wave S are destructively interfered. Thus, the surface emitting light output becomes small as shown by a curve c in FIG. 1(b). That is, the field profile is concave.

The two modes have the same threshold gain if radiation loss can be neglected (as in the case of the 1st-order Bragg-coupling which means the use of 1-order gratings). However, the −1st mode has much more radiation loss which implies the output from the surface than the +1mode. Therefore, the threshold gain of the 1 mode becomes higher than the +1 mode due to the difference in radiation loss. This means that the constructive interference increases the laser threshold. Thus, the 1 mode cannot lase. As a result, single-mode oscillation of the +1 mode which has smaller radiation loss is realized.

Accordingly, the +1 mode oscillates because of its small radiation loss. Thus, the radiation mode output around the cavity center becomes almost zero as represented by a curve c in FIG. 1(b). This is an undesirable radiation field pattern, in which output is separated around the both-ends, from realized. Thus, the output efficiency is very small and it detracts from the advantage of the narrow beam divergence.

Furthermore, the switching operation for current injection into the whole laser cavity requires a relatively large current.

Moreover, when the optical power of the propagation mode is concentrated on a limited area along the cavity, the single-mode capability is deteriorated due to the spatial hole-burning (Soda et. al, The Institute of Electronics, Information and Communication Engineers, Japan, Report OQE 87-7, pp. 49–56, 1986).

OBJECT AND SUMMARY OF THE INVENTION

An object of the present invention is to provide a grating-coupled surface emitting laser capable of emitting a light beam in the direction perpendicular to the substrate as a radiation modes from a limited small region along the cavity direction, and a method for the modulation thereof.

Another object of the present invention is to provide a grating-coupled surface emitting laser capable of operating in a single longitudinal mode, and a method for the modulation thereof.

Another object of the present invention is to provide a grating-coupled surface emitting laser less affected by the axial hole-burning, and a method for the modulation thereof.

Still another object of the present invention is to provide a grating-coupled surface emitting laser capable of modulating with a high speed by low currents, and a method for the modulation thereof.

Another object of the present invention is to provide a grating-coupled surface emitting laser capable of modulating with a high speed by light beams, and a method for the modulation thereof.

Another object of the present invention is to provide a grating-coupled surface emitting laser which remarkably simplifies optical information equipments and optical communication systems by facilitating the optical coupling and the designing of driving circuits, and a method for the modulation thereof.

Another object of the present invention is to provide a grating-coupled surface light emitting laser which does not require the cleaved facets and the processes thereof.

Another object of the present invention is to provide a grating-coupled surface emitting laser of which performance can be tested as a wafer before isolating into laser chips.

Another object of the present invention is, to provide a grating-coupled surface emitting laser with a remarkably high mass-productivity.

A grating-coupled surface emitting laser of the present invention has a feature that the surface emitting output is obtained only from a limited region which has a larger radiation intensity than a region along the cavity. These grating-coupled surface emitting lasers have an active layer combined with a waveguide layer with 2nd or higher-order corrugations in the propagation direction.

This grating-coupled surface emitting laser is preferably divided along the cavity into a plurality of regions which can be independently pumped. The total cavity length can be varied independently by controlling the excited levels of the plural regions, where the cavity is defined as an effectively pumped region along which light waves propagate. The output field pattern of the radiation mode can be changed along the cavity by controlling the amount of the phase shift of the gratings.

A plurality of regions may be pumped by current injection or a light beam. A part of them may be pumped by the current injection or the other part may be pumped by the light beam.

The present invention can be summarized as the surface emitting output being obtained from limited regions which have larger light intensities than other regions along the cavity, thereby making it possible to obtain a beam with a very narrow divergence from a small spot, and a method of modulation.

For instance, the oscillation occurs at the Bragg wavelength in the grating coupled-type surface emitting semiconductor laser with a $\lambda/4$ phase shifter. The radiation mode field ($|R+S|^2$) and the guided mode field ($|R|^2+|S|^2$) of the 0-order mode (0-order mode lases just at the Bragg wavelength) along the axial direction have a common distribution profile indicated by a curve a shown in FIG. 2. Therefore, there is a possibility of obtaining the radiation mode output over the whole cavity length. Furthermore, this Bragg (0) mode has a large threshold gain difference ($\Delta\alpha L = \alpha_0 L - \alpha_{\pm 1} L$) from the other longitudinal modes such as +1 mode (where the gain difference $\Delta\alpha$ is normalized by multiplying the cavity length L). As a result, even if the loss due to the radiation output is larger in the 0 mode (Bragg mode) than that in the +1 mode which has a very small radiation loss whose profile is indicated by b in FIG. 2, the Bragg mode can oscillate because of this large gain difference.

When the normalized coupling coefficient $\kappa L$ is larger than 1.25, the guided wave is concentrated on a region around the $\lambda/4$ phase shifter. Here, the coupling coeffecient $\kappa$ represents the degree of coupling between R wave and S wave and L represents the cavity length. Therefore, a convex intensity profile is obtained and the radiation can be emitted effectively (FIG. 2 shows the case of $\kappa L = 2.0$).

However, the strongly waving distribution of the internal optical intensity of the guided mode (expressed as $|R|^2+|S|^2$) introduces the axial hole-burning phenomenon. Soda et al., "Stability in Single Longitudinal Mode Operation in GaInAsP/InP Phase-Adjusted DFB Lasers," IEEE Journal of Quantum Electronics, Vol. QE-23, No. 6, June 1987, pp. 804–814. The single longitudinal mode behavior of DFB lasers is affected by this phenomenon. In the case of the $\lambda/4$ shift DFB structure, the strong optical concentration on the $\lambda/4$ phase-shifter decreases the threshold gain difference $\Delta\alpha L$ though this value is initially extremely large. In fact, the Bragg mode (0-mode) often jumps to the +1 mode just after lasing occurs.

The hole-burning along the axial direction can be minimized by setting the normalized coupling coefficient $\kappa L$ at the value around 1.25. This is because the intensity profiles becomes uniform over the whole cavity length. In this case, however, it becomes difficult to concentrate the radiation power (output) on a micropoint.

This grating-coupled surface emitting laser can be realized as follows. That is, the electrode at the light output side is divided into plural regions through which corresponding light emitting regions can be excited independently by injecting the current. Thus, the excitation level of each of the plural regions can be adjusted independently (the distribution of the radiation mode light intensity distribution is expressed as $|R+S|^2$). This multi-electrode structure makes it possible to control the light intensity just under a small output window opened in the electrode at the center and then to modulate the surface output.

The modulation method will be described.

First, the modulation is carried out by means of the change in the effective cavity length by changing the excited cavity length L. In general, even if a $\lambda/4$ phase exists at the cavity center, the mode power at the center becomes small if the value of $\kappa L$ is much smaller than 1.25. In this case, the radiation output can not be obtained at all from the central output window. However, once the outer regions are excited, the effective cavity length L increases, and then the $\kappa L$ value is increased.

As a result, the value of $\kappa L$ becomes larger than 1.25, the radiation mode intensity at the center increases and the optical output is emitted from the window.

In another modulation method, the output from the window can be controlled by varying the amount of an equivalent phase shift. Namely, when the $\kappa L$ value is larger than 1.25 and the phase shift corresponding to $\kappa/4$ ($\lambda$; wavelength in the waveguide) are given, the oscillation occurs at the Bragg wavelength and then the strong radiation can be obtained from the central region.

This is explained as follows. The radiation mode distribution always shows a concave profile along the cavity (the central intensity equals zero) if the effective refractive index is uniform along the whole cavity. This is because the threshold gain of the +1 mode is the smallest due to its concave distribution. On the other hand, once a $\lambda/4$ phase shift is given by controlling the effective refractive index of the central region, the strong radiation mode of the 0-mode is emitted from the center. As a result, by providing a small window at the central portion of the electrode, the surface emitting output can be modulated.

Furthermore, the grating-coupled surface light emitting laser of the present invention has a plurality of phase shifts.

The phase shifts may be fabricated by providing the actual phase shifters to the gratings or by changing the effective refractive index of the waveguide structure.

Preferably, in this grating coupled surface emitting laser at least one of the plural phase means has an electrode divided into a plurality of regions each being electrically isolated.

In the modulation method of the grating-coupled surface emitting laser of the present invention, the light output pattern of the radiation mode along the cavity direction can be controlled by independently pumping the plural regions, which means the control of the amount of the phase shift.

A plurality of regions may be pumped by the current injection or light beams. A part of them may also be pumped by the current injection and the other part may be pumped by the light.

In other words, the light emission pattern of the radiation mode can be drastically controlled by independently adjusting at least one of the amounts of the phase shift by current injection or optical pumping. By providing the output window between two of the phase shifts, the output from a small spot can be modulated.

Furthermore, according to this method, a stable concentration of the radiation mode on limited regions can be achieved by eliminating the effect of the hole-burning.

It should be noted here that the downward radiation will be reflected from the bottom electrode and causes an undesired interference with the upward output. The reflection should be eliminated by inserting an absorptive layer, or the reflected light from the bottom should be constructively interfered with the output light to enhance the net output intensity.

As described above, according to the present invention a stable surface light emission in a single longitudinal mode is obtained. Moreover, the radiation mode output may be efficiently obtained because of the concentration of the radiation power on a small area due to the constructive interference. The present invention also enables a high speed and highly efficient modulation by current injection or optical pumping. Furthermore, a radiation beam with a very narrow divergence may be obtained from a microemission region.

Consequently, the present invention simplifies optical information equipment and optical communication equipment using this component because it facilitates the optical coupling and the design of the driver circuit.

The facet-cleaving procedure is not required because of its surface emission feature.

Furthermore, wafer-evaluation is possible before the chipping procedure. Therefore, productivity is improved.

DETAILED DESCRIPTION OF THE PREFERRED EMBODIMENT

A grating-coupled surface emitting semiconductor laser and a modulation method thereof according to the present invention will be described with reference to the drawings below.

EXAMPLE 1

Figure 1A:
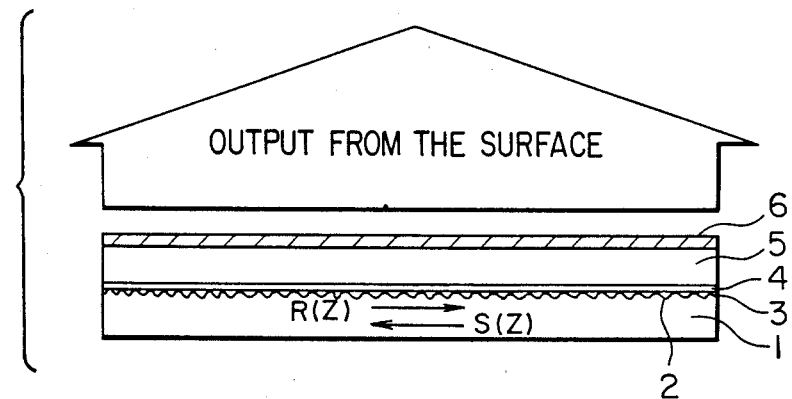
FIG. 1(a) shows a conventional edge-emitting DFB laser, and 1(b) shows a light intensity distribution thereof.
Figure 1B:
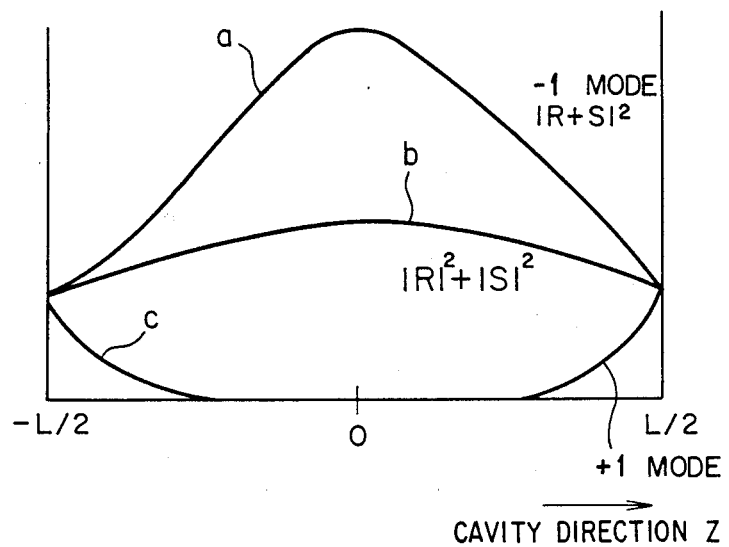
Figure 2:
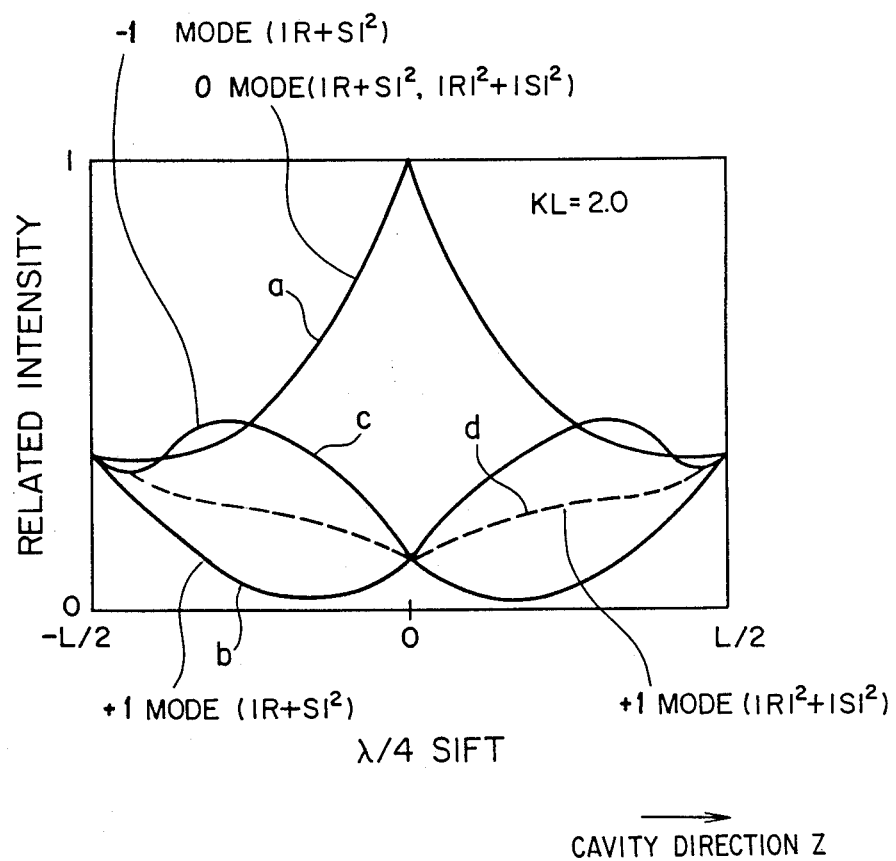
FIG. 2 shows a light intensity distribution of a grating coupled surface emitting laser of the present invention.
Figure 3A:
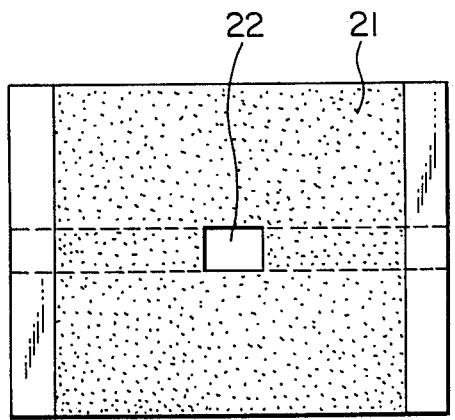
FIGS. 3(a)-3(c) show a cross-sectional and a plan view of a grating-coupled surface emitting laser according to the first embodiment of the present invention, and 3(d) shows a light intensity distribution thereof.
Figure 3B:
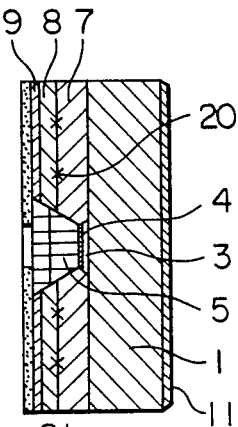
Figure 3C:
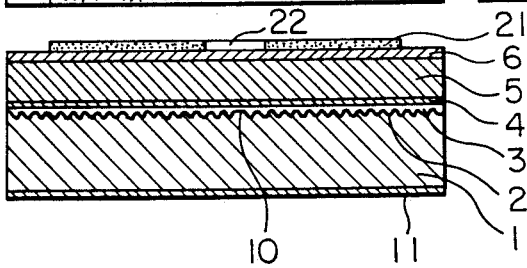
Figure 3D:
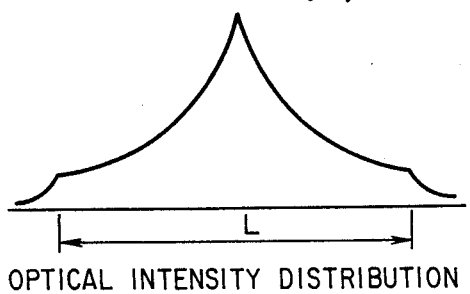

FIGS. 3(a)–3(c) represent a cross-sectional and a plan view of a grating-coupled surface emitting semiconductor laser of the present invention.

On an n-type InP substrate 1, the 2nd-order gratings 2 with a $\lambda/4$ phase shifter 10 is formed. Then an n-type GaInAsP waveguiding layer 3, an undoped GaInAsP active layer 4, a p-type InP cladding layer 5 and a p$^+$-type GaInAsP ohmic contact layer 6 are successively grown thereon by the liquid phase epitaxial (LPE) growth technique. Then, mesa stripes are formed by chemical etching and the surrounding thereof is buried with InP layers 7, 8 which form a reverse-biased p-n junction. A p-type cap layer 9 is formed by the LPE growth technique, thereby constructing a BH structure. Thereafter, a p-side electrode 21 and an n-side electrode 11 are formed.

Consequently, waveguiding layer 3 and active layer 4 have a stripe shape along the center line of the device as shown by a dotted line in the plan view of FIG. 3(a).

The injected current is blocked at the boundary between the InP layers 7 and 8 because the junction 20 is reverse biased. As a result, the current is effectively injected only into the active layer stripe 4.

Moreover, the p-side electrode 21 has an opening (an output window) 22 for obtaining a light from the center region where the $\lambda/4$ phase shifter 10 is provided. With respect to the laser illustrated in FIGS. 3(a)–3(c), a $\kappa L$ value larger than 2.0 can be obtained by making the cavity length L sufficiently long. This makes it possible to concentrate the guided power on the central region. A part of this light power is emitted from the window 22 as the radiation mode caused by 2nd-order gratings.

EXAMPLE 2

Figure 4A:
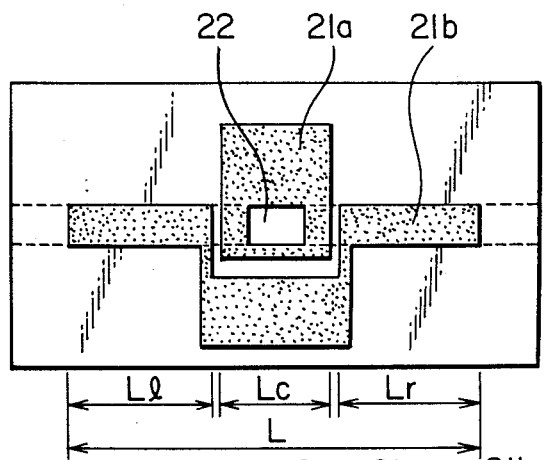
FIGS. 4(a)-4(c) shows a cross-sectional and a plan view of a grating-coupled surface emitting laser of the second embodiment of the present invention, 4(d) shows an intensity distribution when the current is injected into the surrounding electrodes, 4(e) shows an intensity distribution when the current is injected only into the central electrode, and 4(f) shows an intensity distribution when the current is injected into a central electrode and the surrounding electrodes.
Figure 4B:
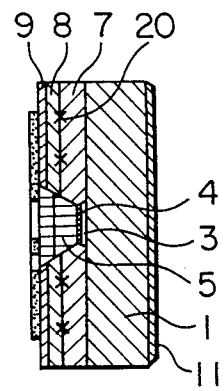
Figure 4C:
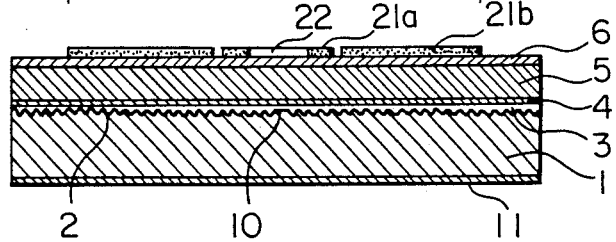
Figure 4D:

FIGS. 4(a)–4(c) illustrate a cross-sectional and a plan view of the grating-coupled surface emitting semiconductor laser according to the present invention.

This grating-coupled surface emitting laser uses GaInAsP/InP material as in the first embodiment. The structure of the p-side electrode 21 is the only difference from the embodiment 1.

Namely, the p-side electrode 21 is separated into a central electrode 21a and the other surrounding electrodes 21b and electrical currents can be independently injected into each of them.

The central electrode 21a has a light output window 22.

The coupling coefficient $\kappa$ of the 2nd-order gratings 2 is about 20 cm$^{-1}$. The excited region length Lc by the central electrode 21a is set at about 200 μm and $\kappa L_c=0.4$. The surrounding electrode region lengths Ll and Lr are 400 μm, respectively (then $\kappa\cdot(Ll+Lr)=1.6$).

Thus, the value of $\kappa L$ becomes 2.0 if the current is injected into all the electrodes (21a and 21b). This is enough value to concentrate the light power on the central portion.

Cares should be taken in order that too much power concentration due to too large $\kappa L$ value introduces a modal jump to another mode because of the axial holeburning.

When a bias current of about 80 mA is injected into only the surrounding electrode 21b, the intensity distributions of the surrounding regions which have lengths of Ll and Lr are shown in FIG. 4(b) and the optical energy is lost inside thereof (this means that the radiation light power attenuates in the non-excited regions around both ends and in the central portion. Thus, if the surface other than the window 22 is covered with an absorptive electrode material or an absorptive quaternary layer, the light cannot be emitted. Also, the intensity distribution of each cavity becomes concave because of the destructive interference between the radiation modes produced by the running wave R and the scattered wave S.

Figure 4E:
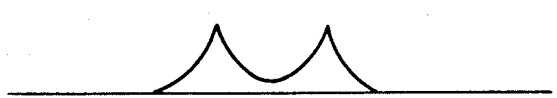
Figure 4F:
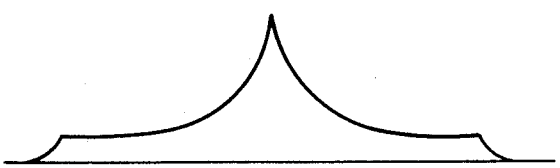

When the switching current of about 20 mA is fed to the central electrode region 21a, which is equal to the same injection current density as that fed to the surrounding electrode region 21b, the light power concentrates on the central portion, as shown in FIG. 4(f). Therefore, it becomes possible to obtain a narrow divergence, high radiance and high power radiation beam (where, $\kappa L$ is about 2.0).

This implies that a large light output can be obtained by a small switching pulse.

The switching operation is also possible by an optical pumping with a light beam incident on the central electrode 21a instead of the current excitation. In such a case, the electrode should be transparent. In this case, a large bias current amplifies the small optical signal and therefore realizes a light amplifier.

In addition, where the surrounding electrodes 21b are turned off and only the central electrode 21a is turned on, the light distribution has a concave profile around the cavity center, resulting in a very low output level. Here, by injecting currents into the surrounding electrodes 21b step by step or into the surrounding electrodes 21b divided into a plurality of electrodes one by one, multi-leveled outputs can be obtained, which means the light output level from the central portion can be adjusted (modulated).

EXAMPLE 3

Figure 5A:
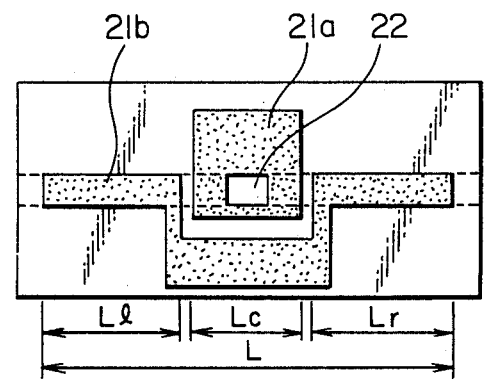
FIGS. 5(a)-5(c) shows a cross-sectional and a plan view of a grating-coupled surface emitting laser of the third embodiment of the present invention, 5(d) shows a light intensity distribution under the condition of the uniform carrier injection, and 5(e) shows a light intensity distribution under the condition of nonuniform carrier injection.
Figure 5B:
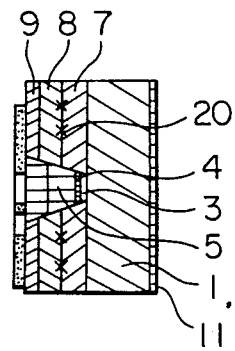
Figure 5C:
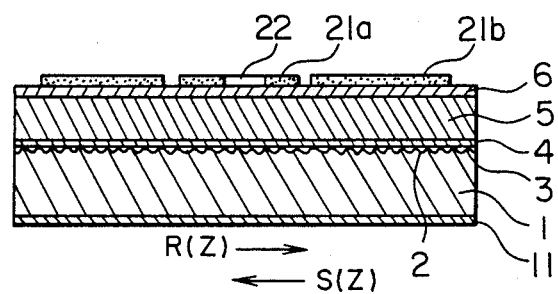

FIGS. 5(a)–5(c) illustrate a cross-sectional and plan view of the grating-coupled surface emitting laser of the present invention.

Figure 5D:

This is the same as the embodiment 2, but it uses gratings without any real phase shifters (designated by 10 in FIG. 4(e)). The length Lc of the central electrode 21a is relatively short, about 30 μm. The lengths Ll and Lr of the surrounding electrodes 21b are about 150 μm, respectively. As a result, a uniform carrier injection is realized as shown in FIG. 5(d) by the injection of the currents 30 mA and 3 mA into the surrounding electrodes 21b and the central electrode 21a, respectively. The +1 order mode then oscillates. More specifically, there appears less radiation power from the central region and more from the surrounding regions. In this case, the light output cannot be obtained from the window 22.

Figure 5E:
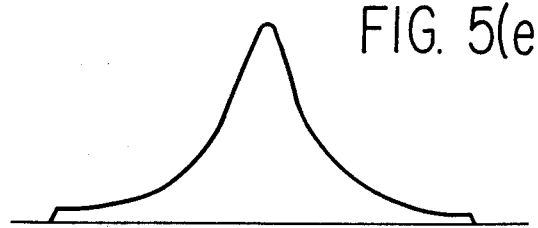

Next, applying the current of 10 mA to the central electrode 21a under the same bias condition, the effective refractive index varies depending on an increase of the injected carrier density. If the refractive index around electrode 21a satisfies the equivalent $\lambda/4$ shift condition equivalently, an oscillation at the Bragg wavelength (0 mode) occurs concentrating the radiation mode on the central region as shown in FIG. 5(e). At the same time, a beam with a narrow divergence angle ($\theta \times \theta L = 30° \times 1°$) is emitted from the window 22 almost perpendicular to the substrate.

In this embodiment, however, when output power from the small window reaches several milliwatts or more, a mode jump to the next sub-mode occurs due to the axial hole-burning. This is because the 0-mode has a convex intensity profile.

In the method according to this embodiment, the $\kappa L$ value is not controlled as in the embodiment 2 but the amount of the phase shift is controlled equivalently.

In the embodiments 1 through 3, not only the radiation power is concentrated on the central window region but also the propagation mode power is concentrated there, degrading the stability of the single-mode capability (the axial hole-burning is responsible for it). In other words, there is a limitation for realizing an extremely high concentration of the radiation mode.

The desired feature is that the intensity distribution of the propagation modes along the axial direction is uniform but the intensity of only radiation mode is very large at the region below the output window.

Such grating-coupled surface emitting lasers will be described as a fourth embodiment.

EXAMPLE 4

Figure 6:
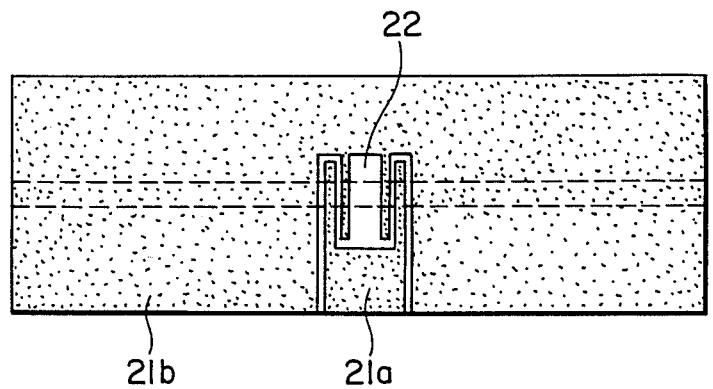
FIG. 6(a) shows a plan view of a grating-coupled surface emitting laser of the fourth embodiment of the present invention, 6(b) and 6(c) are its cross-sectional views from the side and the front.
Figure 6:
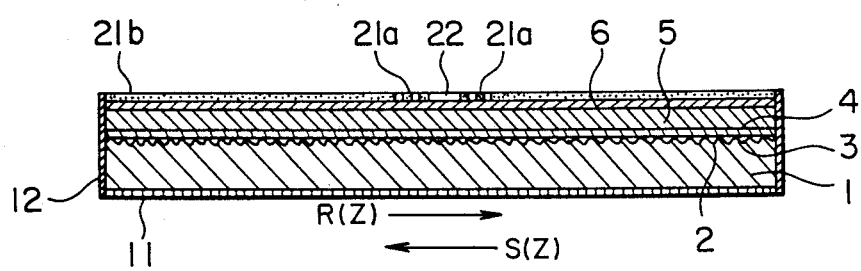
Figure 6:
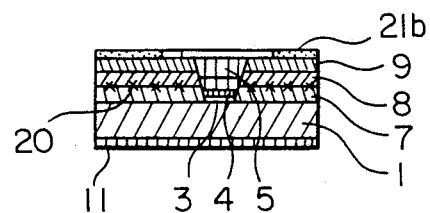

FIGS. 6(a)–6(c) illustrate a cross-sectional and a plan view of the grating-coupled surface emitting laser according to the present invention.

This grating-coupled surface emitting laser uses GaInAsP/InP material as described in embodiment 3. The difference from the embodiment 3 resides in the structure of the p-side electrode 2 and both end facets.

Equivalently small reflectivity ends are realized by forming non-excited absorptive regions. However, for simplicity, the AR-coating 12 is denoted in the drawings here.

The electrode for modulation 21a is comprised of two electrode fingers of 2 $\mu$m width and 30 $\mu$m apart. A 5 $\mu$m wide output window 22 of is opened in the bias electrodes 21b, sandwiched by the electrode fingers 21a.

In this grating-coupled surface emitting laser, the injected carrier density below the modulation electrode 21a can be controlled relative to a fixed density below the bias electrode 21b. This relative change in carrier density causes a change in the refractive index of the active layer 4. The propagating light waves are equivalently subjected to the relative phase change of the gratings. Thus p-side electrode 21 is equivalent to two adjustable phase shifters which are provided at the locations 30 $\mu$m apart. In this case, the total excited cavity length is 300 $\mu$m.

Here, if there is no need to adjust the amount of phase shift, actual phase discontinuities may be built-in the gratings. In this case, the multi-electrode structure as 21a and 21b is not required.

It should be noted that the value of $\kappa L$ is chosen to be about 1.25 so as to make the guided mode relatively uniform, which eliminates the effect of the hole-burning.

Next, the operation of this grating-coupled surface emitting laser will be described.

Figure 7:
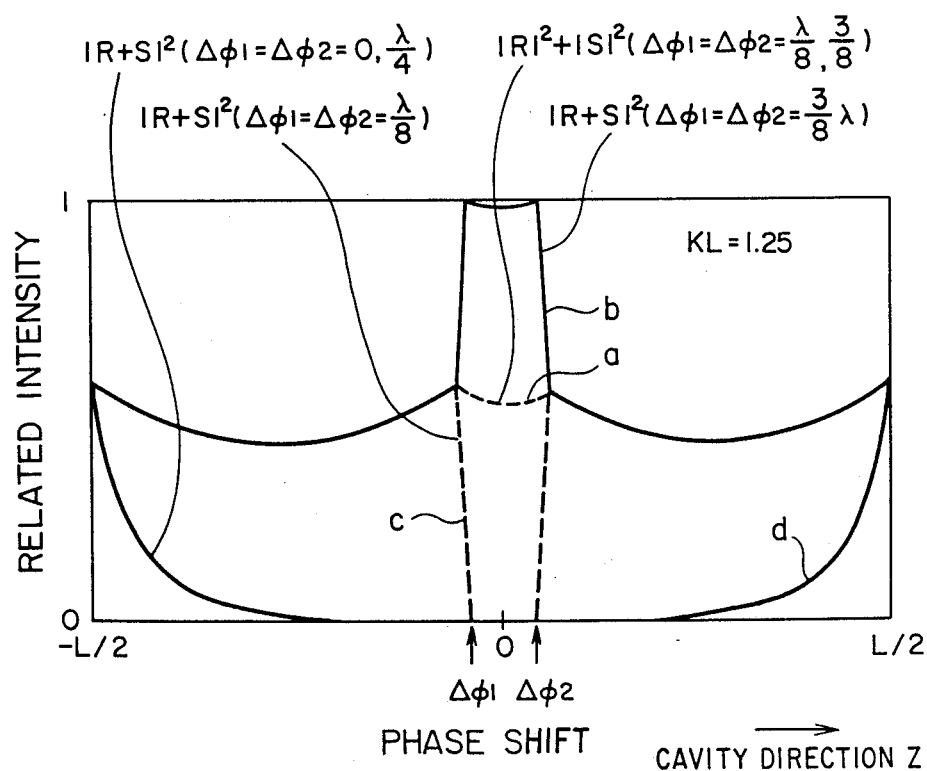
FIG. 7 shows a light intensity distribution in the fourth embodiment of the present invention.

FIG. 7 illustrates the radiation mode intensity distribution ($|R+S|^2$) along the axial direction and a part of the guided mode intensity distribution ($|R|^2 + |S|^2$) as a parameter of the phase shift amounts $\Delta\phi 1$ and $\Delta\phi 2$.

When $\Delta\phi 1 = \Delta\phi 2 = \lambda/8$ ($\lambda$: a guided wavelength), the intensity distribution of the guided mode along the axis direction is represented by the curve a in FIG. 7 and is relatively uniform. When $\Delta\phi 1 = \Delta\phi 2 = 3\lambda/8$, the distribution of the radiation mode ($|R+S|^2$) becomes a profile represented by the curve b. The constructive interference increases the radiation power beneath the light output window 22 at the center. This realizes an efficient radiation output from the window 22.

The output of the grating-coupled surface emitting laser according to the present invention can be modulated by switching the current injection over the whole cavity length. However, the more effective modulation method is to apply the modulation current to the electrode with small electrode fingers 21a, while the bias current is applied to the electrodes 21b to maintain the oscillation.

The distribution of the radiation mode ($|R+S|^2$) is represented by the curve d when the current is applied to the electrode 21a so as to satisfy $\Delta\phi 1 = \Delta\phi 3 = 0$. Then, there is no radiation output from the window 22 (off-state). On the other hand, when the electrode 21a is modulated so as to satisfy $\Delta\phi 1 = \Delta\phi 2 = 3\lambda/8$, the distribution of the radiation mode becomes the curve b, making it possible to emit the radiation mode from the window 22 (on-state). Therefore, a high and efficient modulation becomes possible since the device is highly biased and the small pulse is enough to modulate the output power.

Here, the modulation is also possible under other phase-shift conditions. More specifically, when $\Delta\phi 1 = \Delta\phi 2 = \lambda/8$, the destructive interference occurs only under the window 22 as shown by the curve c. Thus, the light pulse can be generated by modulating from a state of $\Delta\phi 1 = \Delta\phi 2 = \lambda/8$ (off-state) to another state of $\Delta\phi 1 = \Delta\phi 2 = 3\lambda/8$ (on-state).

Figure 8:
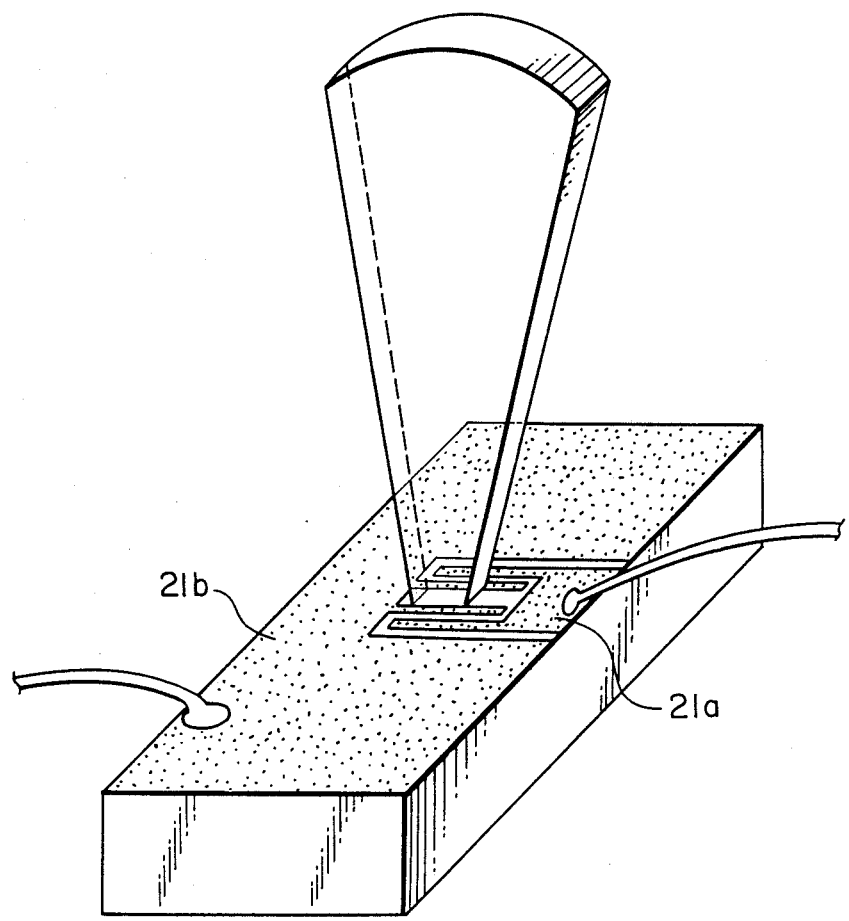
FIG. 8 shows a far-field pattern of the surface emitting output in the fourth embodiment of the present invention.

In FIG. 8, an example of the far-field pattern of the radiation output from this grating-coupled surface emitting laser according to the present invention is shown.

The beam divergence is as narrow as 1° along the cavity direction and about 30° along the transverse direction. The latter is the same as for edge emitting lasers. Where the light emitting area is $5 \times 2$ $\mu m^2$. This provides a sufficiently narrow beam compared with the conventional semiconductor laser or the light emitting diode (LED). Accordingly, the practical coupling of the output beam directly to optical fibers and other optical components is achievable. In addition, the forming of a cylindrical lens or the grating lens on the window 22 will contribute to obtain a narrower beam. Since such a lens is formed by processing the wafer surface, there are few difficulties and it is suitable for the mass-production.

EXAMPLE 5

Figure 9A:
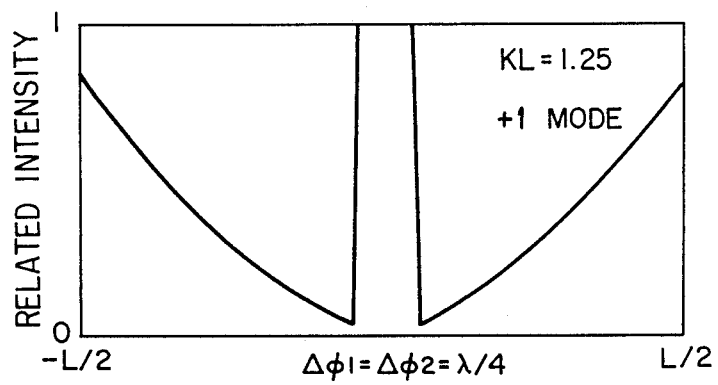
FIG. 9(a) shows a light intensity distribution of +1st order mode of a grating-coupled surface emitting laser according to a fifth embodiment of the present invention (where $\Delta\phi_1=\Delta\phi_2=\lambda/4$), 9(b) shows a light intensity of 1 mode (where $\Delta\phi_1=\Delta\phi_2=\lambda/4$), and 9(c) shows a light intensity distribution of the −1st mode (where $\Delta\phi^1=\lambda/8$, and $\Delta\phi_2=3\lambda/8$).
Figure 9B:
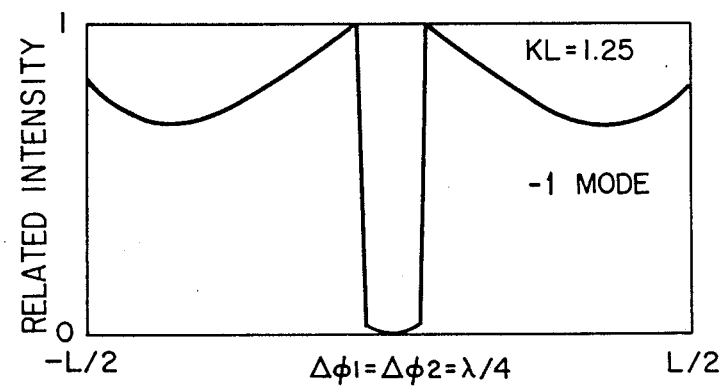

The other grating-coupled surface emitting laser of the present invention will be described with reference to FIG. 9.

In this embodiment, two λ/4 phase shifters are provided at an interval of 30 μm of which a midpoint is located at the cavity center (where cavity length L is 300 μm). In this case, the sum of the two shifts is equal to μ/2, therefore both +1 modes oscillate simultaneously in the absence of loss. If radiation modes exist, the +1 mode has an intensity profile represented by the profile in FIG. 9(a) and the 1 mode has that represented by the profile in FIG. 9(b). Therefore, the +1 mode which has a smaller radiation loss oscillates. The radiation mode between the two phase shifters can be strengthened in this case. As a result, the radiation output may effectively be obtained from the central window.

Figure 9C:
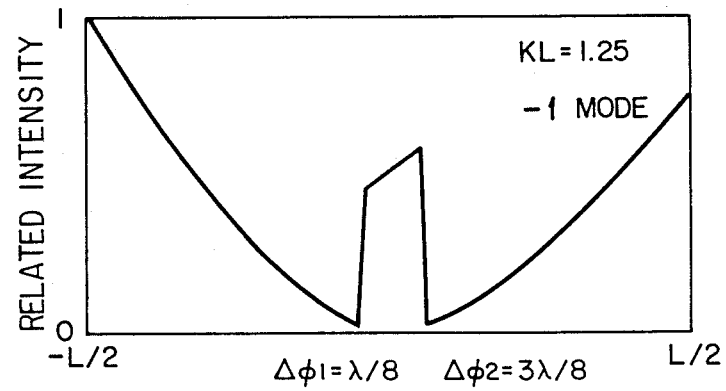

Furthermore, there are other variations of the present invention such that one of the two phase shifters is realized as an actual phase-shift and the other is electrically realized. For instance, as shown in FIG. 9(c), when one of the phase shift $\Delta\phi_2$ is fixed to be 3 λ/8 and another one, $\Delta\phi_1 = \lambda/8$, the +1 mode oscillation occurs and the intensity at the central region becomes large enough to emit light. The emission pattern is then asymmetrical to the cavity center.

The modulation can be performed as follows. Providing the two phase shifters so as to be electrically adjusted, one of the phase shifters is fixed to be constant and another is controlled.

Moreover, the grating-coupled surface emitting laser according to the present invention is not limited to the case where two phase shifters are provided but the cases where three or more phase shifters are provided and the radiation mode at arbitrary regions along the cavity direction is selectively strengthened.

Furthermore, the window for obtaining the light output can be provided on the other side. If mounted in the p-side-down configuration, the window may be formed on the side of the n-side electrode. Here, if the substrate is absorptive for the radiation light (e.g., in the case of GaAs), the removal of a part of the substrate may be included within the gist of the present invention.

What is claimed is:

1. A grating-coupled surface emitting laser, comprising:
    a crystalline active layer structure including
        a wave-guiding layer, and
        a second or higher-order grating extending along a laser cavity of said crystalline active structure, said laser cavity being defined as a length along which light propagation is permitted;
    two electrodes, sandwiching said crystalline active layer structure, for exciting said crystalline active layer structure;
    at least one window, on either of said electrodes, for obtaining an output beam from a surface of said crystalline active layer structure as radiation modes which are produced by two counter-running guided light waves; and
    phase-shifting means for providing an effect of shifting a phase of said grating to cause said radiation modes to interfere constructively in a region of said crystalline active structure corresponding to said window.

2. The grating-coupled surface emitting laser of claim 1, wherein one of said electrodes is divided into a plurality of electrode regions, so that current can be selectively and independently injected into the plurality of electrode regions to excite corresponding active regions of said crystalline active layer structure.

3. The grating-coupled surface emitting layer of claim 1, wherein said phase-shifting means comprises one of said electrodes divided into a plurality of electrode regions, so that electric current can be selectively and independently injected into corresponding active regions of said crystalline active layer structure.

4. The grating-coupled surface emitting laser of claim 1, wherein one of said electrodes has a plurality of windows, so that corresponding active regions of said crystalline active layer structure can be selectively and independently excited by optical pumping through said plurality of windows.

5. The grating-coupled surface emitting laser of claim 1, wherein said phase-shifting means is provided as a plurality of windows in one of said electrodes, so that light beams can be independently introduced through said plurality of windows to excite corresponding active regions of said crystalline active layer structure.

6. A method of modulating a grating-coupled surface emitting laser having a crystalline active layer structure including a wave-guiding layer and a second or higher-order grating extending along a laser cavity of said crystalline active layer structure, said laser cavity being defined as a length along which light propagation is permitted; two electrodes, sandwiching said crystalline active layer structure, for exciting said crystalline active layer structure; at least one window, on either of said electrodes, for obtaining an output beam from a surface of said crystalline active layer structure as radiation modes which are produced by two counter-running guided light waves; and phase shifting means for providing an effect of shifting a phase of said grating to cause said radiation modes to interfere constructively in a region of said crystalline active structure corresponding to said window; and wherein one of said electrodes has at least one of the following first and second electrode configurations,
    in said first configuration said electrode is divided into a plurality of electrode regions, so that current can be selectively and independently injected into the plurality of electrode regions to excite corresponding active regions of said crystalline active layer structure, and
    in said second configuration said electrode has a plurality of windows, so that corresponding active regions of said crystalline active layer structure can be selectively and independently exited by optical pumping through said plurality of windows;
said method comprising the step of:
    controlling an output field pattern of said radiation mode along the cavity, by exciting ones of said active regions independently by at least one of current injection and optical pumping, so as to cause a change in said cavity length.

7. A method of modulating a grating-coupled surface emitting laser having a crystalline active layer structure including a wave-guiding layer and a second or higher-order grating extending along a laser cavity of each crystalline active layer structure, said laser cavity being defined as a length along which light propagation is permitted; two electrodes, sandwiching said crystalline active layer structure, for exciting said crystalline active layer structure; at least one window, on either of said electrodes, for obtaining an output beam from a surface of said crystalline active layer structure as radiation modes which are produced by two counter-running guided light waves; and phase shifting means for providing an effect of shifting a phase of said grating to cause said radiation modes to interfere constructively in a region of said crystalline active layer structure corresponding to said window; and wherein said phase shifting means comprises at least one of the following first and second phase shifting means, said first phase shifting means comprises said electrode divided into a plurality of electrode regions, so that current can be selectively and independently injected into the plurality of electrode regions to excite corresponding active regions of said crystalline active layer structure, and said second phase shifting means comprises a plurality of windows in one of said electrodes so that corresponding active regions of said crystalline active layer structure can be selectively and independently excited by optical pumping through said plurality of windows;

said method comprising the step of:

controlling the output field pattern of said radiation mode along said cavity, by changing amounts of phase-shift of said radiation modes by means of at least one of selectively and independently injecting currents into ones of said plurality of electrode regions and selectively optically pumping through ones of said plurality of windows.

* * * * *

UNITED STATES PATENT AND TRADEMARK OFFICE
CERTIFICATE OF CORRECTION

PATENT NO. : 4,958,357
DATED : September 18, 1990
INVENTOR(S) : Junichi Kinoshita It is certified that error appears in the above-identified patent and that said Letters Patent is hereby corrected as shown below:

Claim 3, column 12, line 1, change --layer-- to "laser".

Claim 7, column 12, line 59, change --each-- to "said".

Signed and Sealed this

Twentieth Day of April, 1993

Attest:

MICHAEL K. KIRK

*Attesting Officer*   Acting Commissioner of Patents and Trademarks